United States Patent [19]
Dreps

[11] Patent Number: 5,027,183
[45] Date of Patent: Jun. 25, 1991

[54] ISOLATED SEMICONDUCTOR MACRO CIRCUIT

[75] Inventor: Daniel M. Dreps, Endicott, N.Y.

[73] Assignee: International Business Machines, Armonk, N.Y.

[21] Appl. No.: 513,310

[22] Filed: Apr. 20, 1990

[51] Int. Cl.⁵ .................. H01L 27/04; H01L 27/12; H01L 27/02

[52] U.S. Cl. .................................. 357/48; 357/49; 357/50; 357/51; 357/86

[58] Field of Search .................. 357/48, 50, 51, 49, 357/67, 68, 86

[56] References Cited

U.S. PATENT DOCUMENTS

| | | | |
|---|---|---|---|
| 3,474,285 | 10/1969 | Gretzberger | 315/11 |
| 3,617,399 | 11/1971 | Fowler | 148/175 |
| 3,772,577 | 11/1973 | Planey | 317/235 |
| 3,777,230 | 12/1973 | Can et al. | 317/235 |
| 3,928,091 | 11/1975 | Tachi et al. | 148/175 |
| 3,961,354 | 6/1976 | Kuwagata | 357/39 |
| 3,992,232 | 11/1976 | Kaji et al. | 148/175 |
| 3,993,513 | 11/1976 | O'Brien | 148/175 |
| 3,998,673 | 12/1976 | Chow | 148/175 |
| 4,152,823 | 5/1979 | Hall | 29/571 |
| 4,240,843 | 12/1980 | Celler et al. | 148/1.5 |
| 4,257,060 | 3/1981 | Kawamata et al. | 357/49 |
| 4,398,206 | 8/1983 | Neilson | 357/46 |
| 4,419,684 | 12/1983 | Sakai et al. | 357/40 |
| 4,446,476 | 6/1983 | Isaac et al. | 357/50 |
| 4,514,749 | 4/1985 | Shoji | 357/68 |
| 4,541,000 | 9/1985 | Colquhoun | 357/15 |
| 4,578,695 | 11/1986 | Delaporte et al. | 357/48 |
| 4,585,958 | 4/1986 | Chung et al. | 307/473 |
| 4,628,343 | 12/1986 | Komatsu | 357/84 |
| 4,641,108 | 2/1987 | Gill, Jr. | 330/307 |
| 4,691,224 | 9/1987 | Takada | 357/53 |
| 4,725,747 | 2/1988 | Stein et al. | 307/579 |
| 4,729,816 | 3/1988 | Nguyen et al. | 148/33.3 |
| 4,757,363 | 7/1988 | Bohm et al. | 357/23.13 |
| 4,796,073 | 1/1989 | Bledsoe | 357/34 |
| 4,861,731 | 8/1989 | Bhagat | 437/51 |

FOREIGN PATENT DOCUMENTS 911060 9/1972 Canada ........................... 356/38
1558957 1/1980 United Kingdom .

OTHER PUBLICATIONS

IBM Technical Disclosure Bulletin, vol. 31, No. 7, Dec. 1988.
IBM TDB, vol. 9, No. 9, Feb. 1967, p. 1229, "Low-Capacitance, Monolithic Integrated Circuit", V. Doo et al.
IBM TDB, vol. 20, No. 10, Mar. 1978, pp. 3966-3967, "Integrated NPN-PNP Driver Circuit", E. Klink et al.

Primary Examiner—Rolf Hille
Assistant Examiner—Mahshid Saadat
Attorney, Agent, or Firm—Arthur J. Samodovitz

[57] ABSTRACT

Individual stages of a multistage electronic receiver include a pair of conductive isolation regions around each stage to isolate each stage from the other stages and thereby prevent feedback and external noise problems. Each pair of isolation regions includes a P+ ring and an N+ ring adjacent to each other to shunt hole carriers and electron carriers, respectively. Removal of the carriers does not have to wait for recombination of the carriers. The region which has the same conductivity type as the substrate extends entirely through an epitaxial or diffused layer to the substrate to collect hole carriers in the substrate.

22 Claims, 5 Drawing Sheets

ISOLATED SEMICONDUCTOR MACRO CIRCUIT

BACKGROUND OF THE INVENTION

The invention relates generally to semiconductor devices, and deals more particularly with a semiconductor macro circuit which is electrically isolated from other adjacent semiconductor macro circuits integral therewith and other sources of external electrical noise.

There are many semiconductor technologies presently known. One common technology provides semiconductor devices produced in an epitaxially grown layer on a substrate of opposite conductivity or polarity. Another common technology provides semiconductor devices produced in a diffused layer.

External noise and internal feedback problems have arisen, particularly when the semiconductor devices form sensitive, high gain amplifiers. In such a case, a small amount of external noise or internal feedback can obscure the input signal or even drive the amplifier into oscillations. One route of the noise is laterally through the semiconductor epitaxially layer or diffused layer which contains the semiconductor devices or laterally through the lower substrate layer, to the input of a transistor or other sensitive device.

Heretofore, it was known to provide a single, low impedance isolation ring around a sensitive transistor i.e., a high gain (high beta) transistor used as an amplifier stage. For example, if the transistor is formed in an epitaxial layer, an isolation ring of opposite polarity to the epitaxial layer is diffused from the surface of the epitaxial layer to the substrate, and either floated or tied to a voltage. The voltage is ground voltage if the isolation ring is P type and positive power supply voltage if the isolation ring is N type. For a P type isolation ring, noise in the form of hole carriers traveling laterally through the epitaxial layer is shunted through the isolation ring to ground. For an N-type isolation ring, noise in the form of electron carriers travelling through the epitaxial layer is shunted through the isolation ring to the power supply voltage. Thus, the single isolation ring has proven effective in isolating the transistor from moderate levels of noise. If many sensitive transistors are provided in the same epitaxial or diffused layer, then each can be protected by its own single isolation ring.

Nevertheless, some noise hole carriers or electron carriers travel underneath the isolation ring through the substrate, and then interfere with the adjacent semiconductor devices. The noise problem does not dissipate until the noise hole carriers and electron carriers recombine, and this can slow the operation of the main device. Therefore, in high gain amplifiers, additional prior art precautions have been taken. The semiconductor chip containing an input stage/pre-amplifier can be physically separated by a spacing from the semiconductor chip containing the output/driver stage so that noise from the output/driver stage cannot feed back through the semiconductor layers to the input stage. While such a technique is effective in reducing the feedback, this technique is undesirable because it requires fabrication and interconnection of two separate chips.

Accordingly, a general object of the present invention is to provide a highly effective technique for isolating a stage of amplification or other macro device from external noise or internal feedback.

Another general object of the present invention is to provide a technique of the foregoing type which can be used to isolate different stages of a single amplifier yet permit the entire amplifier to be made from a single semiconductor chip.

A more specific object of the present invention is to provide an isolation technique which need not wait for recombination of hole and electron carriers.

SUMMARY OF THE INVENTION

The invention resides in a semiconductor device comprising a macro semiconductor circuit formed in a first semiconductor layer. The semiconductor layer can be an epitaxially layer grown on a substrate or a diffused layer. A first semiconductor isolation region is formed in the semiconductor layer around the macro device, and a contact is provided for connecting the first isolation region to a voltage source or ground. A second semiconductor isolation region is also formed in the semiconductor layer around the first isolation region, and has a contact for connecting the second isolation region to a voltage source or ground. The two isolation regions have opposite conductivity type. A second semiconductor layer adjoins the first semiconductor layer and has an opposite conductivity type as the first semiconductor layer. The isolation region which has the same conductivity type as the second semiconductor layer extends entirely through the first semiconductor layer to the second semiconductor layer, and the other isolation region preferably extends only partially through the first isolation region. The P-type isolation region shunts noise holes to ground and the N-type isolation region shunts noise electrons to a positive voltage source.

Within each macro device, another isolation ring having the opposite conductivity type as the first semiconductor layer can be provided around sensitive transistors or other electronic components to increase the isolation.

DETAILED DESCRIPTION OF THE PREFERRED EMBODIMENTS

Figure 1:
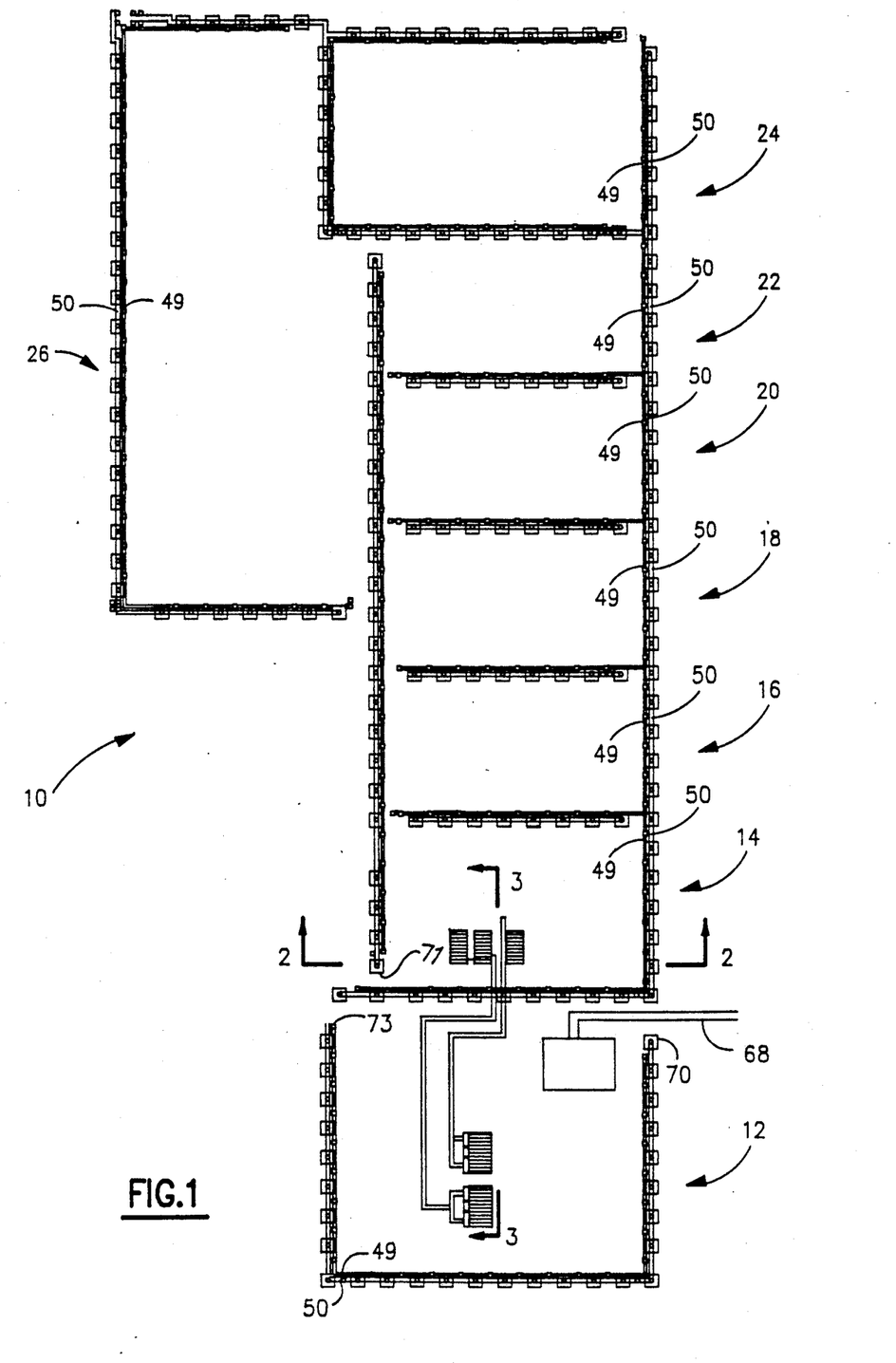
FIG. 1 is a schematic top view of the stages and a few of the many semiconductor components of a multi-stage amplifier, and the isolation regions of the present invention surrounding each stage.

Referring now to the drawings in detail wherein like reference numerals indicate like elements throughout the several views, FIG. 1 illustrates portions of a multi-stage amplifier generally designated 10 which amplifier includes the present invention. Amplifier 10 is comprised of a pre-amplifier or input stage 12, a buffer stage 14, a first gain stage 16, a second gain stage 18, a third gain stage 20, a fourth gain stage 22, an output/driver stage 24, and a feedback stage 26. All of these stages 12-26 are formed in one integral semiconductor chip.

Each of these stages comprises a multiplicity of semiconductor devices such as transistors, diodes, resistors, capacitors, etc. However, only some of the semiconductor devices within stages 12 and 14 are shown because the invention does not depend on the particular semiconductor devices which make up each of these stages.

The invention relates to macro isolation rings or regions 49, 50 which, in the illustrated embodiment, substantially surround each of the stages of amplifier 10. The regions 49, 50 prevent feedback between stages, particularly internal noise created by driver stage 24 from feeding back through the semiconductor layers to pre-amplifier 12 or any other stage. Also, the isolation regions 49, 50 prevent external noise from travelling through the semiconductor layers to pre-amplifier 12 or any other stage of the amplifier 10. It should be noted that isolation regions 49, 50 according to the present invention can also be used to isolate other types of macro devices.

Figure 2:
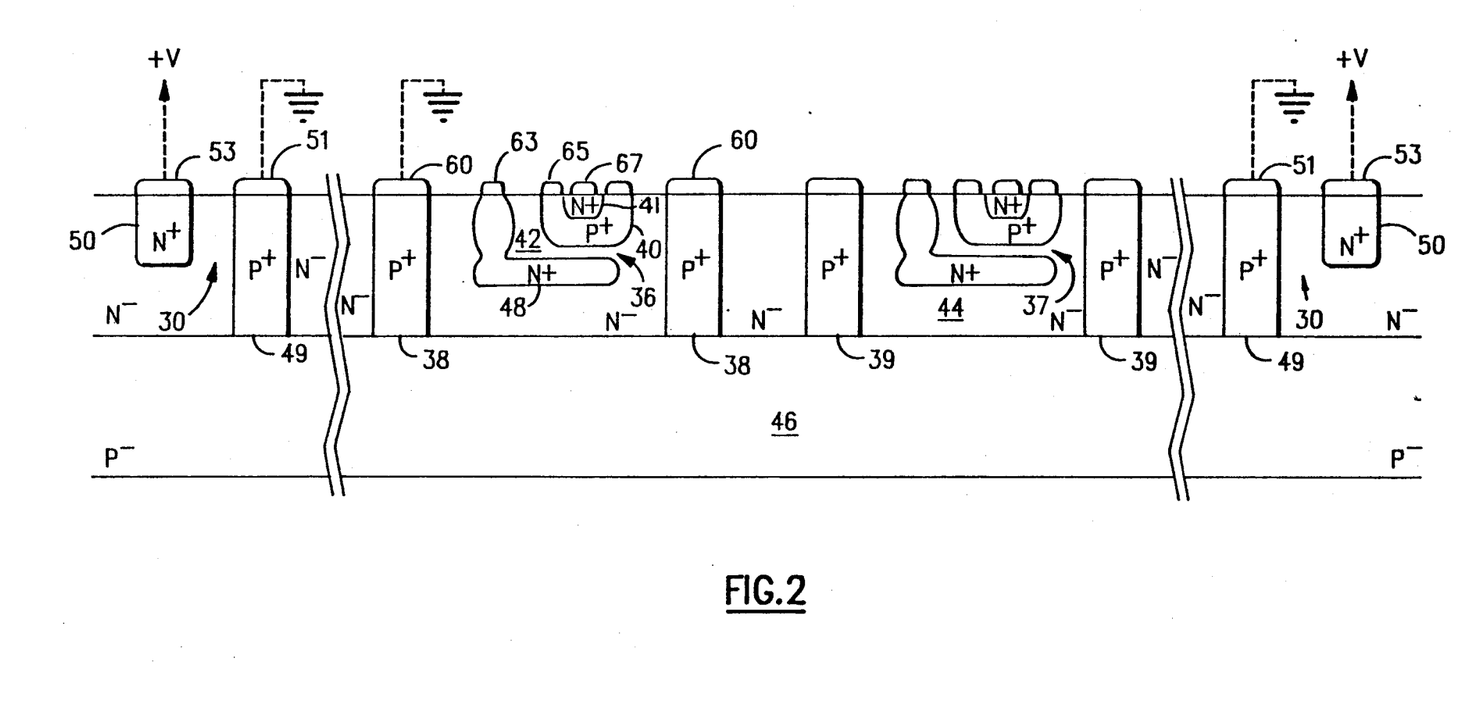
FIG. 2 is an enlarged fragmentary, cross-sectional view of FIG. 1 taken along the plane 2—2 of FIG. 1.

FIG. 2 illustrates in cross-section a portion of pre-amplifier 12 which contains a transistor 36, a local isolation ring 38 surrounding transistor 36, transistor 37, local isolation ring around 39 around transistor 37, and isolation region 49, 50 around pre-amplifier 12 according to the present invention. The transistors 36 and 37 are formed in an N type epitaxial layer 44 which was grown on a P type substrate 46. However, it should be understood that the present invention is also useful in diffused layer technology. Transistor 36 is a standard NPN transistor having a diffused N+ region 41 forming the emitter of the transistor, a diffused P+ region 40 forming the base of the transistor, and N− region 42 which forms the collector of the transistor and is part of the N type epitaxial layer 44. Transistor 36 also includes an N+ type subcollector 48. Suitable contacts 63, 65 and 67 are provided on the surface of layer 44 for regions 41, 40 and 48, respectively. Isolation ring 38 has a P+ conductivity, extends from the surface of epitaxial layer 44 through the entire thickness of epitaxial layer 44 to substrate 46 and surrounds transistor 36. Isolation ring 38 is connected to ground via a contact 60 to shunt noise holes to ground and away from transistor 36. Transistor 37 and local isolation ring 39 are identically constructed as transistor 36 and local isolation ring 38.

Each region 49, has the same polarity or conductivity type as substrate 46 and in the illustrated embodiment is P+ type. Region 49 is diffused from the surface of epitaxial region 44 through the entire thickness of epitaxial layer 44 to substrate 46. Region 50 has the opposite polarity as substrate 46 and in the illustrated embodiment is N+ type. Region 50 is diffused from the surface of epitaxial layer 44 into epitaxial layer 44. In the illustrated embodiment, N+ region 50 extends only part way through epitaxial layer 44 to minimize the width of region 50, but if desired could extend entirely through layer 44. P+ region 49 is grounded via metallic contact strip 51 to collect and shunt noise holes (from leakage hole currents and injection hole currents) to ground. This is effective for D.C. and transient hole injection. N+ region 50 is connected via metal contact strip 53 to a positive power supply voltage to collect and shunt noise electrons to the power supply voltage. Because P+ region 49 and N+ region 50 are adjacent to each other, the noise carriers are removed without waiting for them to recombine. This allows operation of the macro device at high speed.

The following Table I lists preferred ranges of and one specific example of the concentrations and dimensions of the foregoing elements illustrated in FIG. 1:

TABLE I

| ELEMENT | PREFERRED CONCENTRATION OR CONDUCTIVITY RANGE | DIMENSIONS RANGE | DIMENSIONS EXAMPLE |
| --- | --- | --- | --- |
| N EPITAXIAL LAYER 44 | $10^{15}$–$10^{16}$ ATOMS/cm$^3$ | 1.5–10.0 MICRONS (THICKNESS) | 2.0 MICRONS (THICKNESS) |
| P SUBSTRATE LAYER 46 | 10–20 OHM/cm | N.A. | N.A. |
| P+ REGION 38 | $10^{17}$–$10^{18}$ ATOMS/cm$^3$ | 3–30 MICRONS (WIDTH) | 5.0 MICRONS (WIDTH) |
| P+ REGION 49 | $10^{17}$–$10^{18}$ ATOMS/cm$^3$ | 4–28 MICRONS (WIDTH) | 6 MICRONS (WIDTH) |
| N+ REGION 50 | $10^{17}$–$10^{18}$ ATOMS/cm$^3$ | 4–28 MICRONS (WIDTH) | 6 MICRONS (WIDTH) |
| SEPARATION N+ REGION 50 TO P+ REGION 49 | | 2–14 MICRONS | 3 MICRONS |

The example given in Table 1 for the width dimensions is applicable for a 2.0 micron bipolar technology. For a smaller dimension technologies, rings 49, 50 can be located closer to isolation ring 38 to conserve "real estate".

As listed in table 1, the lateral resistivity of substrate 46 is substantial, 10–20 ohm centimeters. The resistance vertically through P+ region 49 is very low in view of the small thickness of epitaxial layer 44 and the high concentration of P+ region 49, and the vertical resistance through N+ region 50 is very low in view of the small thickness of epitaxial layer 44 and the high concentration of N+ region 50. Consequently, noise electrons which travel laterally through P substrate 46 toward N+ region 50 underneath P+ region 49 or from the other direction are shunted to the power supply via N+ region 50, and noise holes which travel underneath N+ region 50 or P+ region 38 in P substrate 56 are shunted to ground via P+ region 49. Regions 49 and 50 also shunt holes and electrons, respectively which travel through epitaxial layer 44 adjacent to these two regions.

Figure 3:
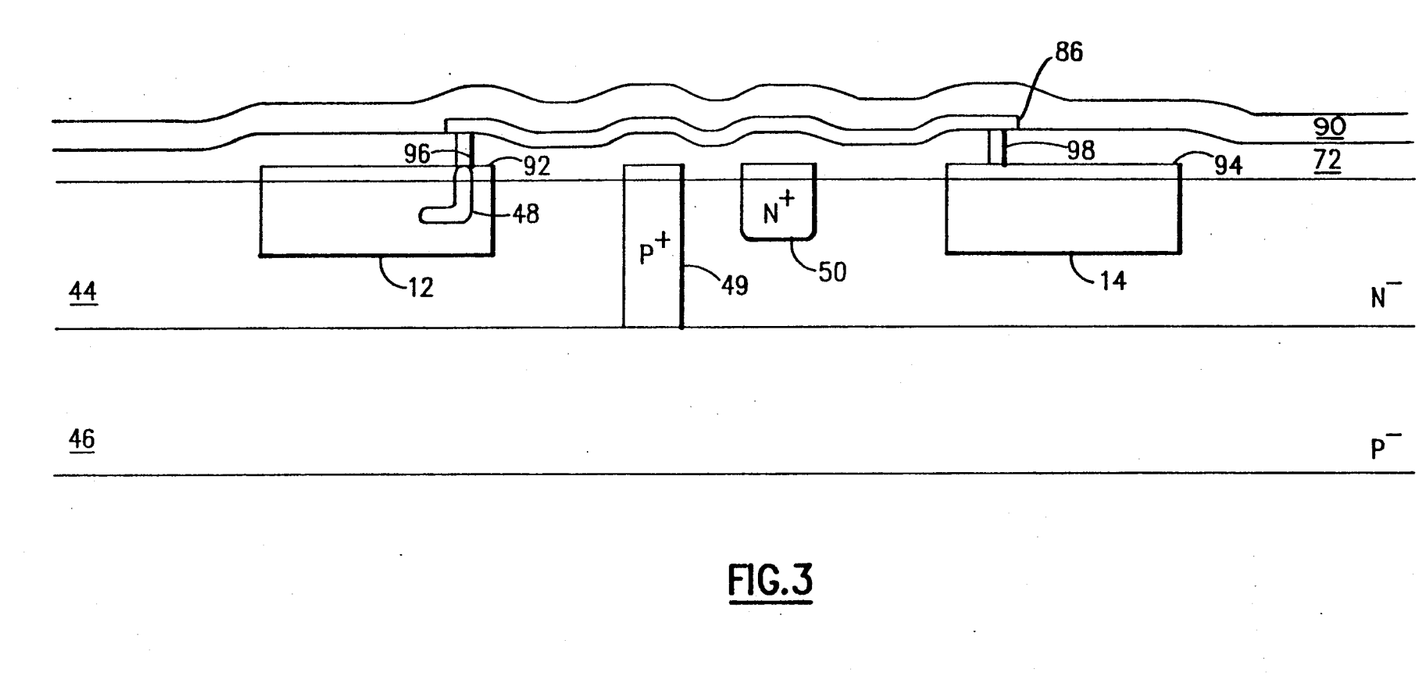
FIG. 3 is an enlarged, fragmentary cross-sectional view, taken along the plane 3—3 of FIG. 1 and illustrates the manner of making an electrical connection between stages, over the isolation rings of FIG. 1.

There are two ways according to the present invention to electrically interconnect two stages or macro devices which are substantially surrounded by regions 49, 50, or electrically connect such a stage to an external device. As illustrated in FIG. 1, small gaps 70, 71, 73 can be provided in regions 49, 50 and a metallic lead 68 integrated in the semiconductor layers can be passed through one or more of the gaps. Alternately, as illustrated in FIGS. 1 and 3, an insulating oxide layer 72 (for example one micron thick) can be grown or otherwise provided on top of stages 12 and 14 and over contacts 51, 53, 60, 63, 65, 67 and all other intrastage metal conductors which are schematically illustrated collectively as 92 and 94 respectively. To interconnect macro 12 with macro 14, holes are etched in insulating layer 72 in registration with the appropriate metal contacts, and metal 96 and 98 is deposited in the holes. Next, a metal lead 86 is deposited on top of insulating layer 72 to connect metal deposit 96 to metal deposit 98 and thereby form a bridge over rings 49, 50. Preferably another oxide layer 90 is grown over oxide layer 72 and metal lead 86 to insulate lead 86.

Figure 4:
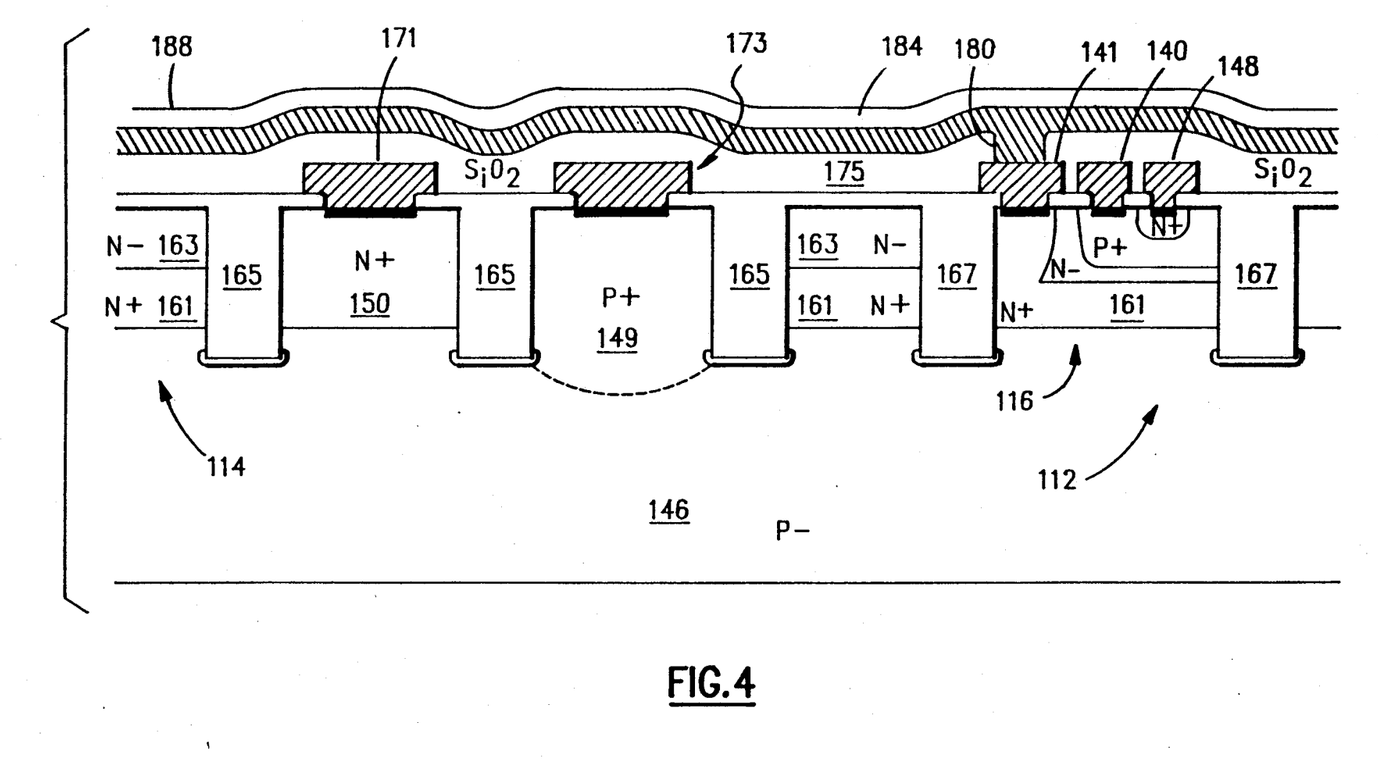
FIG. 4 is an enlarged fragmentary, cross-sectional view of a semiconductor circuit in accordance with another embodiment of the present invention, taken along the line 4—4 of FIG. 5.
Figure 5:
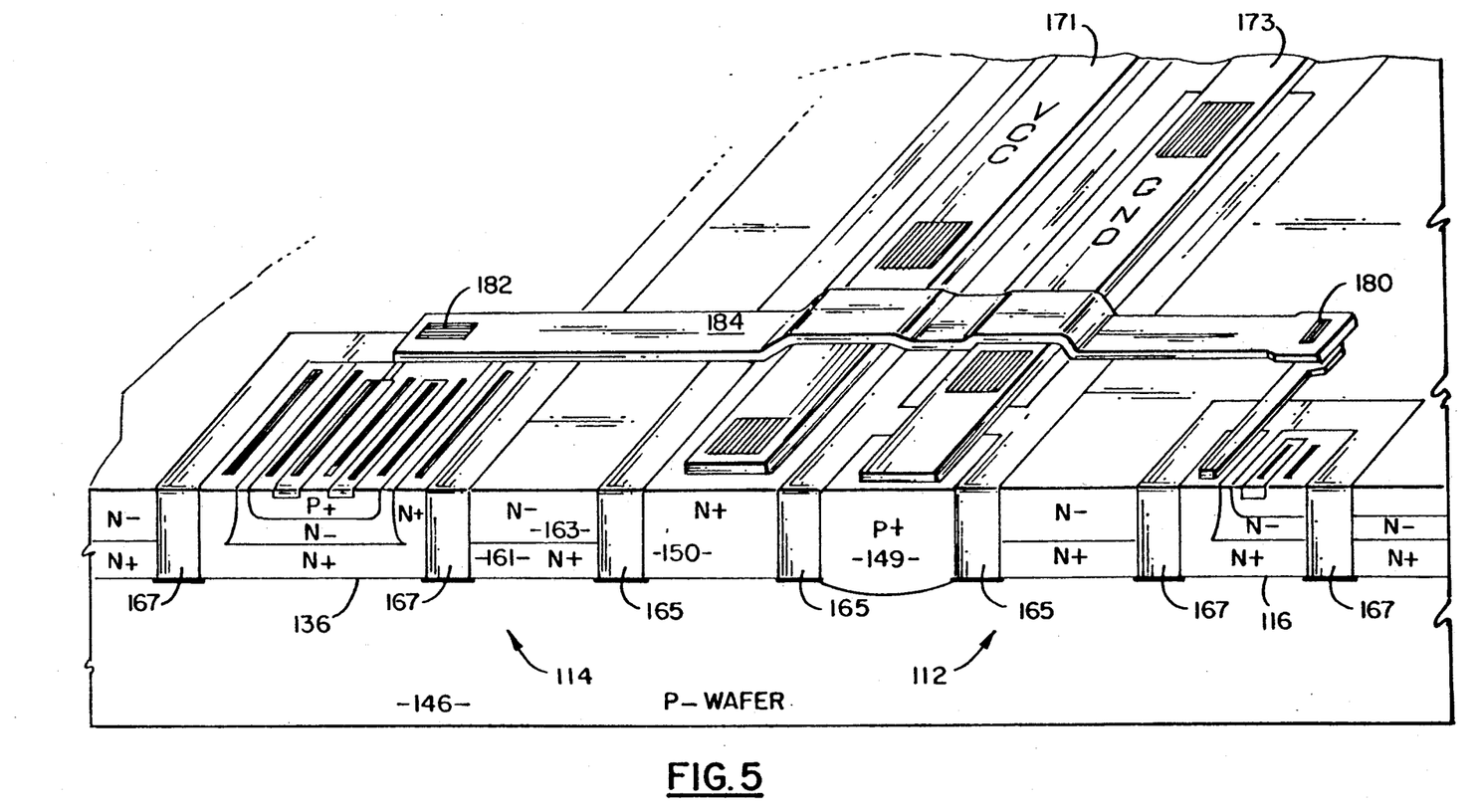
FIG. 5 is a three dimensional view of the embodiment of FIG. 4.

FIGS. 4 and 5 illustrate another embodiment of the present invention. A macro device 112 including a transistor 116 is isolated by rings or regions 149 and 150 from a macro device 114 including a transistor 136. Regions 149 and 150 substantially surround macro device 116. The macro devices and regions 149 and 150 are integrated into one semiconductor chip.

The chip comprises a P− substrate 146 and is formed as follows. A N+ blanket subcollector 161 is grown on the substrate. Next, the bottom portion of P+ region 149 is formed by diffusion into the N+ layer 161, until reaching the substrate. Then, a N− layer 163 is grown over the N+ layer 161 and P+ region 149. Next, the remainder of P+ region 149 is formed by diffusion into the N− layer in registration with the previous P+ diffusion so that region 149 extends from the surface of the upper epitaxial layer to the substrate. Then, an N+ region 150 is diffused into the N− layer 163 so that N+ region 150 extends from the surface of the upper epitaxial layer to the substrate. Next, insulator regions 165 are formed between and around regions 149 and 150, by etching trenches between and around regions 149 and 150 and filling the trenches with an insulator such as glass or polymide. Insulated rings or regions 165 help prevent noise from traveling laterally through the epitaxial layers by providing a barrier and increasing the shunting effectiveness of regions 149 and 150. Insulated rings or regions 167 are also formed around transistors 136 and 137, by etching trenches and then filling the trenches with an insulator such glass or polymide. A conductive strip 171 on the surface of region 150 is used to connect region 150 to a positive power supply, and a conductive strip 173 on the surface of region 149 is used to connect region 149 to ground. Other contacts such as 140, 141, 148 and conductive strips (not shown) in the same layer are used to interconnect electronic components within the same micro device.

Connections between different macro devices, and inputs and outputs of a micro device are provided in the following manner. An insulating layer of glass 175 (shown in FIG. 4 only) is formed over the epitaxial layer 163 and exposed contacts and conductor strips. Next, windows are etched in glass layer 175 in registration with contacts in other conductive strips to permit electrical connection, and the windowed holes are then filled with metal. FIGS. 4 and 5 illustrate two such metal fillings 180 and 182. Next, metal conductor strips such as 184 are deposited over the glass layer 175 and the metal fillings to make the desired connections. As illustrated in FIGS. 4 and 5 also, the metal strip 184 bridges over isolation regions 149 and 150 to interconnect transistors 116 and 136 within macro devices 112 and 114, respectively. Next, the metal strip 184 is covered with another layer of insulation 188.

The following TABLE II lists preferred ranges of and are specific example of the concentrations and dimensions of the foregoing elements illustrated in FIGS. 4 and 5:

TABLE II

| ELEMENT | PREFERRED CONCENTRATION OR CONDUCTIVITY RANGE | DIMENSIONS RANGE | DIMENSIONS EXAMPLE |
| --- | --- | --- | --- |
| N− EPITAXIAL LAYER 163 | $10^{15}-10^{16}$ ATOMS/cm$^3$ | 1.5-10 MICRONS (THICKNESS) | 2.0 MICRONS (THICKNESS) |
| N+ BLANKET SUBCOLLECTOR LAYER 161 | $10^{18}-10^{19}$ ATOM/cm$^3$ | .5-5 MICRONS (THICKNESS) | 1.0 MICRONS (THICKNESS) |
| P SUBSTRATE LAYER 146 | 10-20 OHM/cm | N.A. | N.A. |
| P+ REGION 149 | $10^{16}-10^{17}$ ATOMS/cm$^3$ | 4-28 MICRONS (WIDTH) | 5 MICRONS (WIDTH) |
| N+ REGION 150 | $10^{16}-10^{17}$ ATOMS/cm$^3$ | 4-28 MICRONS (WIDTH) | 6 MICRONS (WIDTH) |
| SEPARATION· N+ REGION 150 TO P+ REGION 149 | | 1-5 MICRONS | 3 MICRONS |
| INSULATION REGION 165 | | 1-5 MICRONS (WIDTH) | 2.5 MICRONS (WIDTH) |
| INSULATION REGION 167 | | 1-5 MICRONS (WIDTH) | 2.5 MICRONS (WIDTH) |

Based on the foregoing, isolated semiconductor circuits embodying the present invention have been disclosed. However, numerous modification and substitutions can be made without deviating from the scope of the invention. For example, if desired, regions 49 and 50 or 149 and 150 can be formed around a single semiconductor transistor or other device instead of around a macro device as illustrated in FIG. 1. Therefore, the invention has been disclosed by way of illustration and not limitation, and reference should be made to the following claims to determine the scope of the invention.

I claim:
1. A semiconductor circuit comprising:
    first semiconductor layer means for forming a semiconductor device;
    a semiconductor device formed at least in part in said first semiconductor layer means;
    a first conductive isolation region formed of semiconductor material in said first semiconductor layer means substantially around said semiconductor device;

first contact means, electrically connected to said first isolation region, for connecting said first isolation region to a voltage source or ground;

a second conductive isolation region formed of semiconductor material in said first semiconductor layer means substantially around said first isolation region, said second isolation region having an opposite conductivity type as said first isolation region;

second contact means, electrically connected to said second isolation region, for connecting said second isolation region to a voltage source or ground; and a second semiconductor layer adjoining said first semiconductor layer means and having an opposite conductivity type as said first semiconductor layer means; and wherein the isolation region which has the same conductivity type as said second semiconductor layer extends entirely through said first semiconductor layer means to said second semiconductor layer, and the isolation region which has the same conductivity type as said first semiconductor layer means has a substantially higher concentration of dopants than said first semiconductor layer means, whereby said isolation region which has the same conductivity type as said first semiconductor layer means is distinct from said first semiconductor layer means.

2. A semiconductor circuit as set forth in claim 1 wherein both of said first and second isolation regions extend entirely through said first semiconductor layer means to said second semiconductor layer.

3. A semiconductor circuit as set forth in claim 1 wherein the isolation region which has the opposite conductivity type as such second semiconductor layer extends from the surface of said first semiconductor layer means only partially through said first semiconductor layer means.

4. A semiconductor circuit as set forth in claim 1 wherein said semiconductor device is a macro circuit.

5. A semiconductor circuit as set forth in claim 4 wherein said macro circuit includes a transistor, a local conductive isolation ring diffused into said first semiconductor layer means around said transistor, and third contact means, electrically connected to said local isolation ring, for connecting said local isolation ring to a voltage source or ground, said local isolation ring having the same polarity as said second semiconductor layer.

6. A semiconductor circuit as set forth in claim 5 wherein said local isolation ring extends entirely through said first semiconductor layer means to said second semiconductor layer, and has a higher conductivity than said second semiconductor layer.

7. A semiconductor circuit as set forth in claim 1 wherein one of said isolation regions is P-type and connected to the ground by the associated contact means, and the other isolation region is N-type and connected to the voltage source by the associated contact means.

8. A semiconductor circuit as set forth in claim 1 further comprising a first insulation ring located within said first semiconductor layer means between said first and second isolation regions.

9. A semiconductor circuit as set forth in claim 1 further comprising first and second insulating rings located within said first semiconductor layer means adjacent to and inside and outside of said first and second isolation regions, respectively.

10. A semiconductor circuit as set forth in claim 1 wherein said first semiconductor layer means comprises a relatively high concentration layer grown on said second semiconductor layer, and a relatively low concentration layer grown on said relatively high concentration layer.

11. A semiconductor circuit as set forth in claim 8 further comprising a local insulation ring located within said first semiconductor layer means, around and adjacent to said semiconductor device, and within said first and second isolation regions.

12. A semiconductor circuit as set forth in claim 1 wherein said first semiconductor layer means comprises a single epitaxial grown layer.

13. A semiconductor circuit as set forth in claim 1
wherein said semiconductor device comprises a multiplicity of semiconductor components including transistors formed in said first semiconductor layer means and interconnected to form a macro device;

further comprising another macro device comprising a multiplicity of semiconductor components including transistors, formed in said first semiconductor layer means integral with the first said macro device; and wherein portions of said first and second isolation regions are located between said macro devices to isolate the macro devices from each other.

14. A semiconductor circuit as set forth in claim 13 wherein said macro devices are stages of one amplifier.

15. A semiconductor circuit as set forth in claim 13 further comprising means for bridging a metallic conductor over said first isolation region and said second isolation region to interconnect a first semiconductor component formed in one of said micro devices to a second semiconductor component formed in the other macro device.

16. A semiconductor circuit as set forth in claim 15 wherein said bridging means comprises an insulating layer formed over said first isolation region, said first contact means, said second isolation region and said second contact means, and a metallic conductor formed over said insulating layer over said first and second isolation regions and formed in holes in said insulating layer which holes are registered with semiconductor components within said macro devices.

17. A semiconductor circuit as set forth in claim 1 wherein said first and second isolation regions are adjacent to each other such that noise carriers of opposite polarity can be removed without recombination.

18. A semiconductor circuit as set forth in claim 1 wherein said first and second isolation regions completely surround said semiconductor device.

19. A semiconductor device comprising:
a first semiconductor layer;
at least one semiconductor component formed in said first semiconductor layer;
a second semiconductor layer supporting said first semiconductor layer and having an opposite conductivity type as said first semiconductor layer;
a first semiconductor isolation region which is located in said first semiconductor layer and substantially surrounds said semiconductor component, said first isolation region having a higher conductivity than said first and second semiconductor layers;
first contact means, electrically connected to said first isolation region, for connecting said first isolation region to a voltage source or ground;

a second semiconductor isolation region which is located in said first semiconductor layer and substantially surrounds said first isolation region, said second isolation region having an opposite conductivity type as said first isolation region, and having a higher conductivity than said first and second semiconductor layers;

second contact means, electrically connected to said second isolation region, for connecting said isolation region to a voltage source or ground; and wherein at least one of said isolation regions extends entirely through said first semiconductor layer to said second semiconductor layer.

20. A semiconductor device as set forth in claim 19 wherein said second semiconductor layer is a substrate;

said first semiconductor layer is an epitaxial layer formed on said substrate; and said one isolation region has the same conductivity type as said substrate.

21. A semiconductor device as set forth in claim 20 wherein both said first isolation region and said second isolation region extend entirely through said epitaxial layer to said substrate.

22. A semiconductor device as set forth in claim 19 further comprising a local isolation ring surrounding said semiconductor component within said first isolation region and extending from the surface of said first semiconductor layer to said second semiconductor layer.

* * * * *